United States Patent [19]

Disko et al.

[11] Patent Number: 5,367,762
[45] Date of Patent: Nov. 29, 1994

[54] DECAPPING MACHINE FOR PACKAGED INTEGRATED CIRCUITS

[75] Inventors: David R. Disko, Austin; Joe G. Durand, Round Rock, both of Tex.

[73] Assignee: Advanced Micro Devices, Inc., Sunnyvale, Calif.

[21] Appl. No.: 996,237

[22] Filed: Dec. 23, 1992

[51] Int. Cl.$^5$ .............................................. H05K 3/30
[52] U.S. Cl. ...................................... 29/764; 29/426.4; 29/426.5
[58] Field of Search .............. 29/764, 758, 762, 426.4, 29/426.5

[56] References Cited

U.S. PATENT DOCUMENTS 4,616,414 10/1986 Cushman ........................... 29/758 X
5,191,705 3/1993 Toensing ................................. 29/764

Primary Examiner—Carl E. Hall
Attorney, Agent, or Firm—Skjerven, Morrill, MacPherson, Franklin & Friel

[57] ABSTRACT

A decapping apparatus is provided for removing the cap portions of cerquad packaged and similarly packaged integrated circuits. The decapping apparatus applies a controlled force in the glass interface area of the packaged integrated circuit to remove the cap of the package while maintaining the integrity of the wire leads and of the ceramic base and cap sections. Furthermore, glass fragments and other debris are prevented from contacting the semiconductor chip that is mounted within the package. The decapping apparatus may include a first blade having a chisel portion and a second blade having a chisel portion and a blocking wall that oppose the chisel portion of the first blade. The first blade and the second blade may abut against a plurality of wire leads that extend between the main body section and a ring section of the packaged integrated circuit.

26 Claims, 5 Drawing Sheets

DECAPPING MACHINE FOR PACKAGED INTEGRATED CIRCUITS

BACKGROUND OF THE INVENTION

1. Field of the Invention

This invention relates to integrated circuits and, more particularly, to the decapping of packaged integrated circuits to allow analysis and testing.

2. Description of the Relevant Art

When the fabrication process of a semiconductor chip is completed, the semiconductor is still vulnerable to contamination and devoid of electrical connections. The semiconductor chip must therefore be mounted within a package and connected to the outside world via package connections. Typical packages include plastic dual in-line packages (PDIP), plastic lead chip carrier (PLCC) packages and glass-sealed cerquad packages.

After a semiconductor chip has been packaged, it is frequently desirable to test and analyze the packaged integrated circuit. If access to the semiconductor chip is required, a portion of the package must be cut or broken to expose the chip. To illustrate this, FIG. 1 is a perspective view of a glass-sealed cerquad packaged integrated circuit 5. The cerquad package includes a main body section 10 having a lower base portion 12 and an upper cap portion 14. The base portion 12 and the cap portion 14 are composed of a hard ceramic material and are sandwiched together such that a semiconductor chip is housed and protected within. A layer of glass forming a glass interface layer 16 is deposited between and bonds the base portion 12 and the cap portion 14. A plurality of wire leads 18 extend from within the main body section 10 to a plastic ring section 19. The plastic ring section 19 is provided to maintain the integrity and uniformity of the wire leads 18.

One approach to exposing the semiconductor chip is to use hand held chisels to crack the glass interface layer 16 and pry the cap portion 14 from the base portion 12. Since access to the glass interface layer 16 is restricted due to the plastic ring section 19, it is difficult to apply a uniform cracking force to decap the main body section 10. Therefore, this approach frequently causes undesirable breakage of the base portion 12 and the cap portion 14 and causes non-uniform breakage of the glass interface layer 16. In addition, the wire leads 18 extending within and from the main body 10 are frequently broken or bent. Finally, minute glass fragments and other debris resulting from the breakage can contact and damage the semiconductor chip, rendering subsequent testing procedures useless.

SUMMARY OF THE INVENTION

In accordance with the present invention, an apparatus is provided for decapping cerquad packaged and similarly packaged integrated circuits. The decapping apparatus applies a controlled force in the glass interface area of the cerquad package to remove the cap of the package while maintaining the integrity of the wire leads and of the ceramic base and cap sections. Furthermore, glass fragments and other debris are prevented from contacting the semiconductor chip that is mounted within the package.

These and other advantages are achieved with the present invention, in accordance with which a decapping apparatus is provided for removing a cap portion from a base portion of a packaged integrated circuit. The packaged integrated circuit includes a main body section and a ring section formed beyond an outer perimeter of the main body section. The decapping apparatus comprises a base, a first blade including a chisel tip formed along a first side of the first blade, and a second blade including a chisel tip formed along a first side of the second blade. The decapping apparatus further comprises a support means coupled to the base for supporting the first and second blades such that the chisel tip of the first blade opposes the chisel tip of the second blade. An actuation means is mechanically coupled to the base for decreasing a distance between the first and second blades, and a device holding means is mechanically coupled to the base for securing the packaged integrated circuit on the decapping apparatus. The chisel portions of the first and second blades are positioned to contact an interface layer between the base portion and the cap portion of the packaged integrated circuit.

In accordance with a second aspect of the invention, a decapping apparatus comprises a base, a first blade having a chisel portion formed along a first side of the first blade, and a blocking member having a blocking wall formed adjacent to a first side of the blocking member. A support means is mechanically coupled to the base for supporting the first blade and the blocking member on the base such that the chisel portion of the first blade opposes the blocking wall of the blocking member. An actuation means is mechanically coupled to the base for decreasing a distance between the first and blade and the blocking member. A device holding means is coupled to the base for securing the packaged integrated circuit on the decapping apparatus. The chisel portion of the first blade is positioned to contact an interface layer between the base portion and the cap portion of the packaged integrated circuit and the blocking wall of the blocking member is positioned to abut against the main body section of the packaged integrated circuit.

The invention will be more readily understood with reference to the drawings and the detailed description. As will be appreciated by one skilled in the art, the invention is applicable to the decapping of integrated circuits in general and is not limited to the specific embodiments disclosed.

DETAILED DESCRIPTION

The following includes a detailed description of the best presently contemplated mode for carrying out the invention. The description is intended to be merely illustrative of the invention and should not be taken in a limiting sense.

Figure 2:
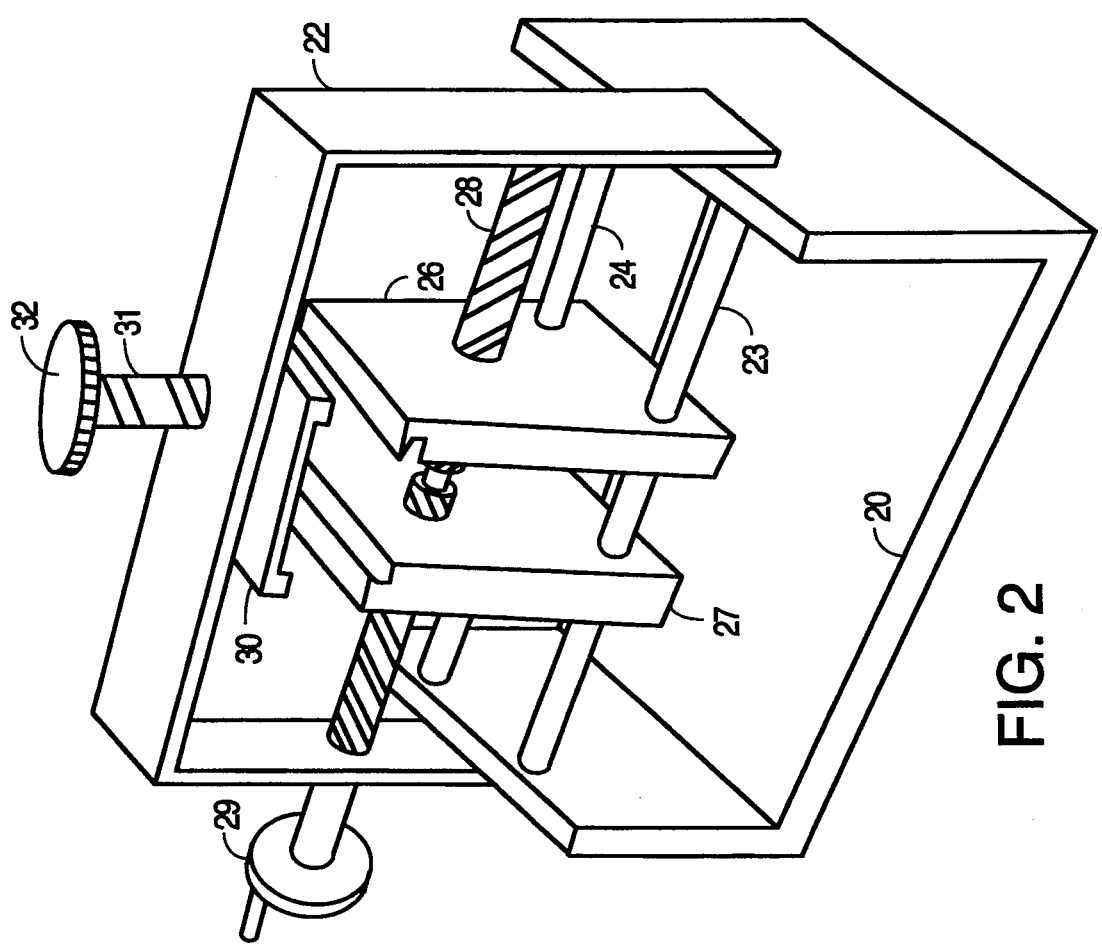
FIG. 2 is a perspective view of a decapping apparatus for removing the cap of an integrated circuit in accordance with the present invention.

Referring to FIG. 2, a perspective view of a decapping apparatus in accordance with the present invention is shown that removes a cap portion of a packaged integrated circuit from a base portion. The decapping apparatus includes a base 20, a support frame 22, and a pair of slide rods 23 and 24. Support frame 22 as well as slide rods 23 and 24 are mounted to base 20. The decapping apparatus also includes a chisel blade 26, a chisel and block blade 27, a screw rod 28 and a blade actuation knob 29. The decapping apparatus finally includes a device holder 30, a second screw rod 31, and a tension adjust knob 32.

The chisel blade 26 and the chisel and block blade 27 each include a pair of holes that form channels through which slide rods 23 and 24 are inserted. The chisel blade 26 and the chisel and block blade 27 also each include a threaded hole to accommodate screw rod 28. One end of screw rod 28 is fitted with a blade actuation knob 29 to allow convenient manual rotation of screw rod 28. The other end of screw rod 28 is coupled to the support frame 22 such that lateral and vertical movement of screw rod 28 is prevented while a rotational motion is facilitated. This arrangement allows for the uniform movement in a lateral direction of the chisel blade 26 and the chisel and block blade 27 when blade actuation knob 29 is rotated by the operator. Roller bearings may be incorporated within the holes of the chisel blade 26 and the chisel and block blade 27 to minimize frictional resistance with slide rods 23 and 24.

The device holder 30, screw rod 31, and tension adjust knob 32 are mechanically coupled such that the device holder 30 is movable in a vertical direction between the support frame 22 and the blades 26 and 27. Support frame 22 includes a threaded hole in the proximity of its center to accommodate screw rod 31.

Figure 1:
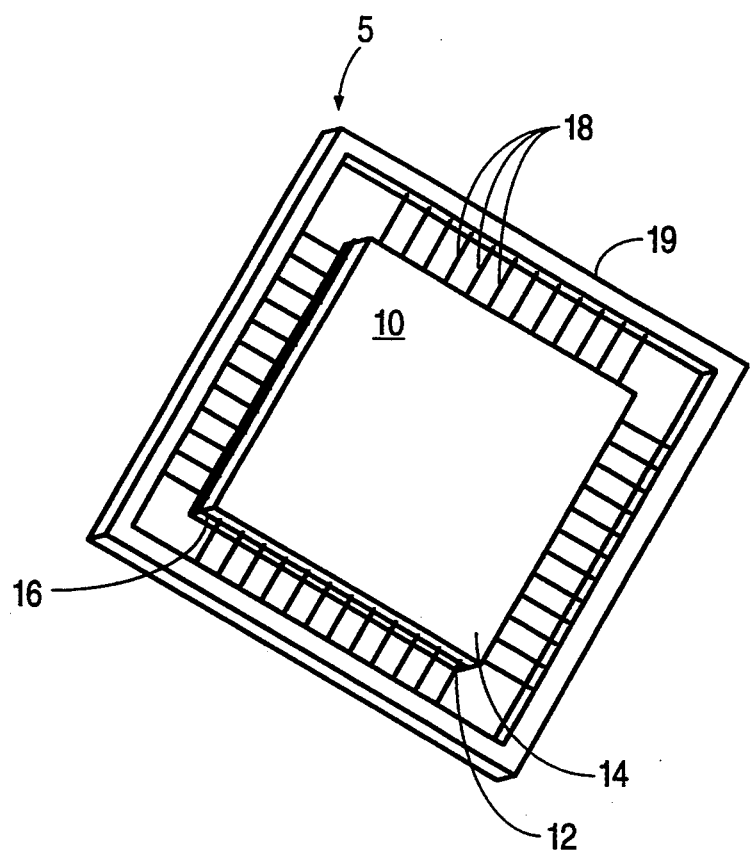
FIG. 1 is a perspective view of a cerquad packaged integrated circuit.
Figure 3:
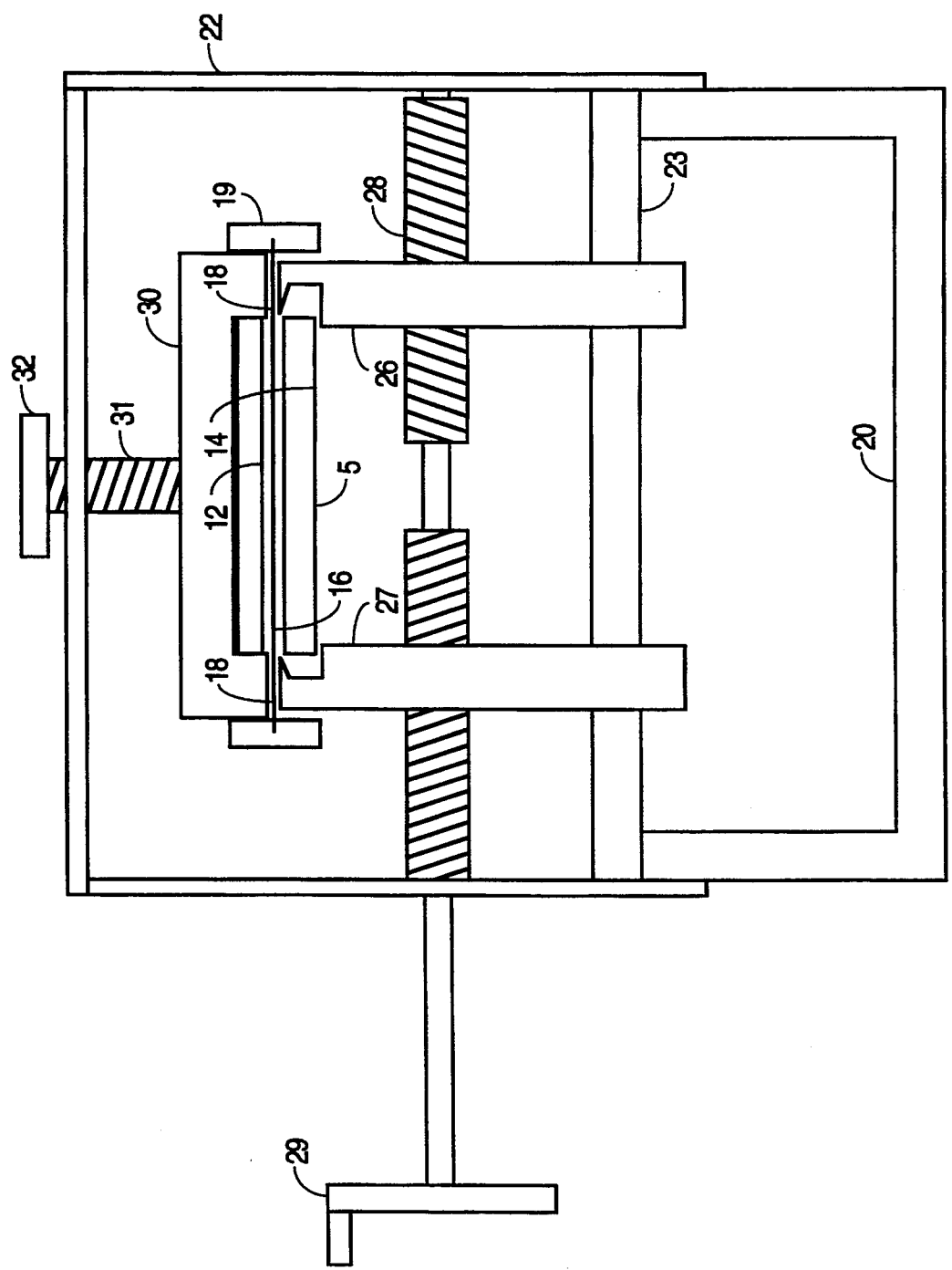
FIG. 3 is a cross-sectional view of a decapping apparatus in accordance with the present invention.

The operation as well as other specific details of the decapping apparatus are next considered. FIG. 3 is a cross-sectional view of the decapping apparatus with a cerquad packaged integrated circuit 5 supported thereon. The various parts of integrated circuit 5 were shown in greater detail in FIG. 1, and corresponding parts are numbered identically.

The integrated circuit 5 must be positioned within the decapping apparatus as shown to prepare for a decapping operation. The device holder 30 is initially raised such that the integrated circuit 5 may be inserted within the decapping apparatus with the wire leads 18 resting upon the top edges of the chisel blade 26 and the chisel and block blade 27. It is noted that integrated circuit 5 is positioned upside down with respect to the decapping apparatus; that is, with the cap portion 14 beneath the base portion 12. It is also noted that the blade actuation knob 29 can be rotated to establish the proper distance between the chisel blade 26 and the chisel and block blade 27 such that the wire leads will rest thereupon. After the integrated circuit is positioned on blades 26 and 27, the device holder 30 is lowered by rotating the tension adjust knob 32 such that the wire leads 18 of the integrated circuit 5 are secured and sandwiched between device holder 30 and blades 26 and 27 as shown in the figure.

Figure 4:
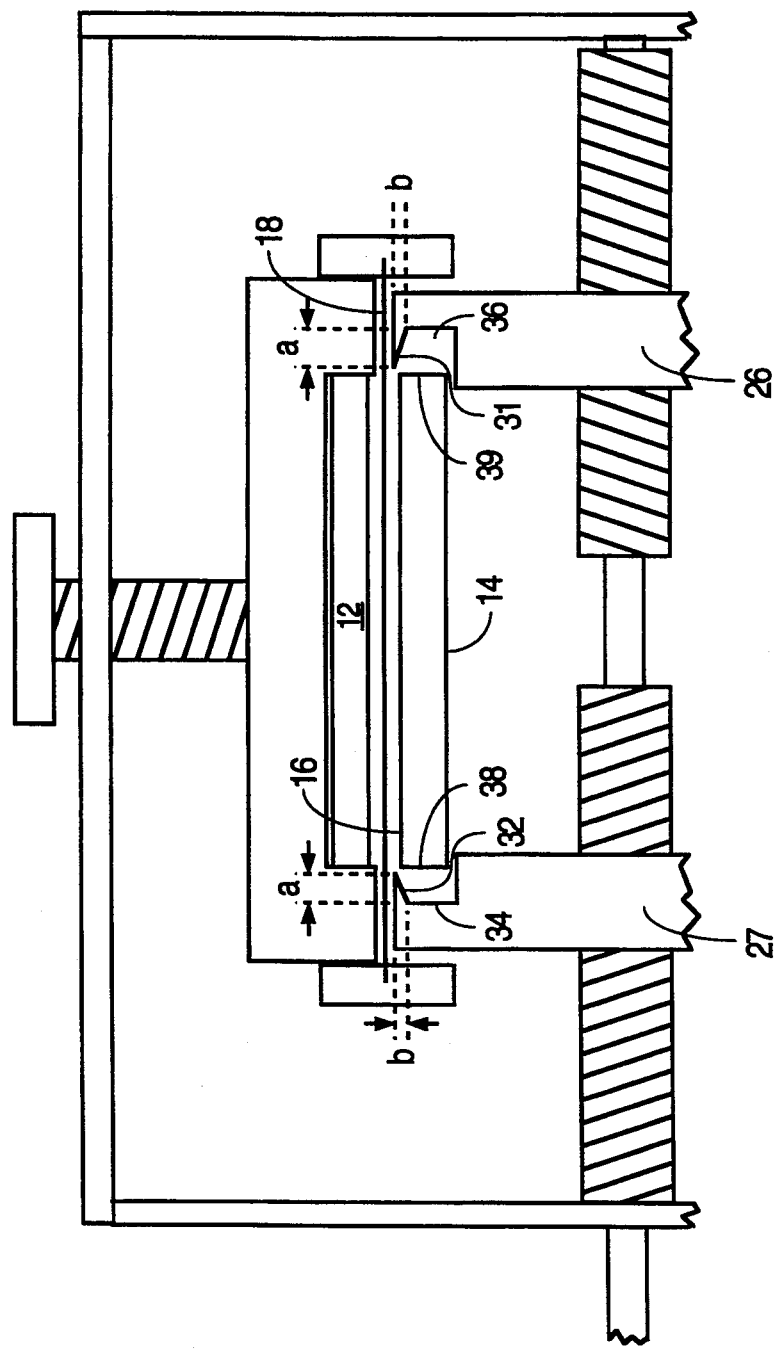
FIG. 4 is an exploded cross-sectional view of the decapping apparatus.

Upon securing the integrated circuit 5 within the decapping apparatus, the operator can proceed with the decapping operation by rotating the blade actuation knob 29. As the blade actuation knob 29 is rotated, the chisel blade 26 and the chisel and block blade 27 move closer together until eventually contacting the glass interface layer 16 of integrated circuit 5. It will be appreciated that chisel and block blade 27 serves as both a chisel member and a blocking member. Referring to the exploded cross-sectional view of the apparatus as shown in FIG. 4, it is noted that a chisel portion 31 formed on chisel blade 26 is longer than a chisel portion 32 formed on the chisel and block blade 27. In addition, the slope or pitch of the chisel portion 31 is less than the pitch of the chisel portion 32. That is, the length "a" of chisel portion 31 is longer than the length "a" of chisel portion 32, and the pitch of chisel portion 31 defined as the ratio of "b/a" is less than the corresponding pitch "b/a" of chisel portion 32.

When the tips of chisel portions 31 and 32 contact the glass interface layer 16, the leftmost side 38 of the cap section 14 of integrated circuit 5 abuts against a block wall 34 of chisel and block blade 27. Since the length "a" of chisel portion 31 is longer than the length "a" of chisel portion 32, the wall 36 of chisel blade 26 does not abut against the rightmost side 39 of cap section 14. Thus, as force is applied to the blade actuation knob 29, a uniform lateral force is exerted upon the leftmost edge 38 of integrated circuit 5 while a uniform lateral force in the opposite direction is exerted upon the glass interface layer 16 by the tip of chisel portion 31. These opposite forces establish a shearing force along the border between the glass interface layer 16 and the cap section 14 and ultimately cause the glass interface layer 16 to crack. The tip of the chisel portion 32 of chisel and block blade 27 creates a fracture point on the leftmost side of the glass interface layer 16. Once the glass interface layer 16 has cracked, the chisel portion 31 penetrates deeper within the main body section of integrated circuit 5 and exerts a downward force on the cap section 14. This causes the cap section 14 to separate from the base section 12 and the wire leads 18 of integrated circuit 5.

It is noted that as the cap section of integrated circuit 5 abuts against the wall 34 of the chisel and blocking blade 27, chisel blade 26 applies a force to the glass interface layer 16 that is initially entirely normal with respect to the side 39 of the integrated circuit 5. As further force is applied to the blade actuation knob 29, the chisel portion 31 of chisel blade 26 cracks and penetrates into the glass interface layer 16 thereby separating the cap section 14 from the main body of integrated circuit 5. This results in a clean breakage of the glass interface layer and minimizes the possibility of any bending of the wire leads and minimizes the possibility of breakage of the ceramic base and cap portions.

It is also noted that since the integrated circuit 5 is positioned upside down within the decapping apparatus, glass fragments and other debris resulting from the breakage fall away from the main body of the integrated circuit and away from the semiconductor chip housed within. Therefore, the integrity of the semiconductor chip is maintained to allow subsequent visual and electrical testing of the integrated circuit.

The decapping apparatus as described may be made with steel or other metal. For increased strength, the chisel blade 26 and the chisel and blocking blade 27 may be composed of carbide or tool steel.

Figure 5:
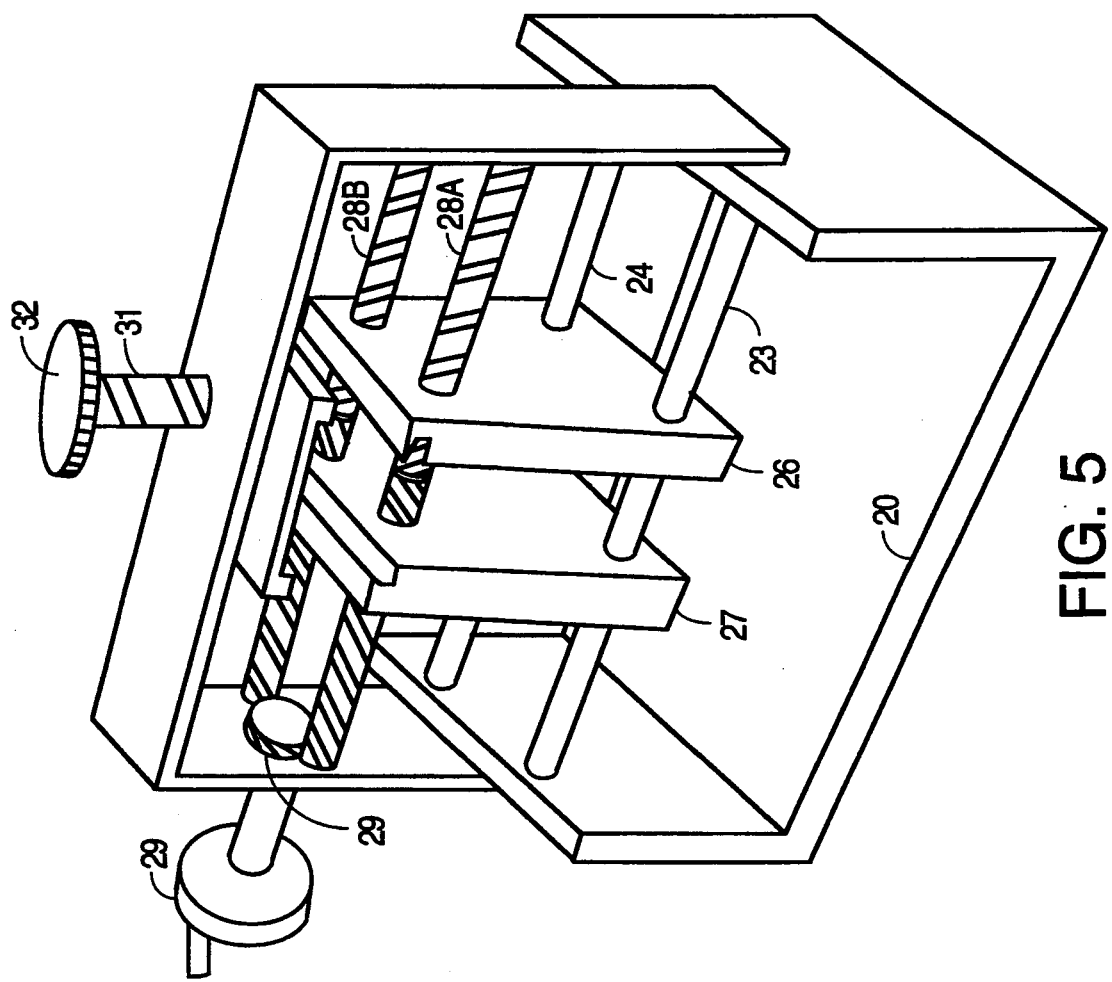
FIG. 5 is a perspective view of a decapping apparatus in accordance with a second embodiment of the present invention.

Referring next to FIG. 5, a decapping apparatus is shown in accordance with a second embodiment of the present invention. The embodiment of FIG. 5 is similar to that of FIG. 2, and corresponding components are numbered identically. In this embodiment, however, a pair of screw rods 28A and 28B are substituted for the single screw rod 28. A coupling gear 29 is further provided to operatively couple screw rods 28A and 28B to the blade actuation knob 29. The embodiment of FIG. 5 may be provided to increase the stability of the blades 26 and 27, and may be advantageous in situations where manufacturing tolerances of the slide rods 23 and 24 and of the threaded holes of blades 26 and 27 vary greatly.

Numerous modifications and variations will become apparent to those skilled in the art once the above disclosure is fully appreciated. For example, although the support frame 22 and base 20 of the decapping apparatus are exemplified in the specific configuration as shown, a variety of alternative configurations could be implemented to operatively support the blades 26 and 27 and device holder 30. Similarly, although the blades 26 and 27 of the embodiments disclosed herein are slidably movable along slide rods 23 and 24, the blades 26 and 27 could be alternatively secured to base 20 in a pivoting or hinged fashion. In addition, an additional set of blades similar to blades 26 and 27 could be provided within the apparatus to apply pressure points along all four sides of the integrated circuit. It is to be understood that the above detailed description of the preferred embodiments is intended to be merely illustrative of the spirit and scope of the invention and should not be taken in a limiting sense. The scope of the claimed invention is better defined with reference to the following claims.

What is claimed is:

1. An apparatus for decapping a packaged integrated circuit, said packaged integrated circuit including a main body comprising a first body portion attached to a second body portion through an interface layer, comprising:
    a first blade including a chisel tip disposed along a first side of said first blade to engage said interface layer;
    a second blade including a blocking member disposed along a first side of said second blade to engage the second body portion of the integrated circuit;
    a support structure, said first and second blades being coupled to the support structure with the first side of said first blade being opposed to the first side of said second blade;
    a device holder having a blocking member to engage the first body portion of the integrated circuit, the device holder being coupled to said support structure; and
    a motion actuator coupled to the support structure for decreasing a distance between said first and second blades while decreasing lateral distance between the blocking member of said second blade and the blocking member of said device holder.

2. The apparatus as recited in claim 1 wherein said first blade is dimensioned to fit between a first side of said main body section and a ring section of said packaged integrated circuit which is disposed beyond an outer perimeter of said main body section, so as to abut against a plurality of wire leads that extend between said first side of said main body section and said ring section, and wherein said second blade is dimensioned to fit between a second side of said main body section opposite the first Side of said main body section and the ring section, so as to abut against a plurality of wire leads that extend between the second side of said main body section and said ring section.

3. The apparatus as recited in claim 1 wherein said first blade includes a channel formed therein and said second blade includes a channel formed therein and said support structure includes first and second slide rods which pass through the channels in said first blade and said second blade.

4. The apparatus as recited in claim 3 wherein said motion actuator includes a screw rod operatively coupled to said first and second blades.

5. The apparatus as recited in claim 1 wherein said second blade includes a chisel tip, and the chisel tip of said first blade is longer than the chisel tip of said second blade.

6. The apparatus as recited in claim 5 wherein a pitch of the chisel tip of said first blade is less than a pitch of the chisel tip of said second blade.

7. The apparatus as recited in claim 1 wherein the blocking member of said second blade is a wall disposed adjacent to the chisel tip of said second blade.

8. A decapping apparatus for removing a cap portion from a base portion of a packaged integrated circuit, said packaged integrated circuit including a main body section comprising the cap portion bonded to the base portion by an interface layer, and a ring section disposed beyond an outer perimeter of said main body section and coupled thereto by a plurality of leads, said decapping apparatus comprising:
    a base;
    a blade having a chisel portion extending from a first side of said first blade;
    a blocking member having a blocking wall transverse to a first side of said blocking member;
    a support structure coupled to said base for supporting said blade and said blocking member with the chisel portion of said blade being opposed to the chisel portion of said blocking member;
    a motion actuator coupled to said base to decrease a distance between said blade and said blocking member; and
    a device holder coupled to said base to secure the base of said packaged integrated circuit in said decapping apparatus;
    wherein the chisel portion of said blade is positioned to penetrate said interface layer, and the blocking wall of said blocking member is positioned to push against the cap of said packaged integrated circuit so that a shearing force is established in said interface layer when the distance between said blade and said blocking member is decreased.

9. The decapping apparatus as recited in claim 8 wherein said packaged integrated circuit is securable on said decapping apparatus such that the first side of said first blade abuts against a group of the leads comprising leads that extend between a first side of said main body section and said ring section of said packaged integrated circuit, and such that the first side of said blocking member abuts against another group of the leads comprising leads that extend between an opposite side of said main body section and said ring section of said packaged integrated circuit.

10. The decapping apparatus as recited in claim 8 wherein said support structure includes first and second slide rods adapted to allow said blade and said blocking member to move slidably along said first and second slide rods.

11. The decapping apparatus as recited in claim 10 wherein said motion actuator includes a screw rod operatively coupled to said blade and to said blocking member.

12. The decapping apparatus as recited in claim 8 wherein said blocking member includes a chisel tip extending from the first side of said blocking member and adjacent to the blocking wall.

13. The decapping apparatus as recited in claim 12 wherein the chisel tip of said blade is longer than the chisel tip of said blocking member.

14. The decapping apparatus as recited in claim 13 wherein a pitch of the chisel tip of said blade is less than a pitch of the chisel tip of said blocking member.

15. A decapping apparatus for removing a cap portion from a base portion of a packaged integrated circuit, said packaged integrated circuit including a main body section and a ring section formed beyond an outer perimeter of said main body section, said decapping apparatus comprising:
   a base;
   a first blade including a chisel tip formed along a first side of said first blade;
   a second blade including a chisel tip formed along a first side of said second blade, wherein the chisel tip of said first blade is longer than the chisel tip of said second blade;
   support means mechanically coupled to said base for supporting said first and second blades on said base such that the chisel tip of said first blade opposes the chisel tip of said second blade;
   actuation means mechanically coupled to said base for decreasing a distance between said first and second blades; and
   a device holding means mechanically coupled to said base for securing said packaged integrated circuit on said decapping apparatus;
   wherein the chisel tips of said first and second blades are positioned to contact an interface layer between said base portion and said cap portion of said packaged integrated circuit.

16. The decapping apparatus as recited in claim 15 wherein said packaged integrated circuit is securable on said decapping apparatus such that the first side of said first blade abuts against a plurality of wire leads that extend between a first side of said main body section and said ring section of said packaged integrated circuit, and such that the first side of said second blade abuts against a plurality of wire leads that extend between an opposite side of said main body section and said ring section of said packaged integrated circuit.

17. The decapping apparatus as recited in claim 15 wherein said support means includes first and second slide rods adapted to allow said first blade and said second blade to move slidably along said first and second slide rods.

18. The decapping apparatus as recited in claim 17 wherein said actuation means includes a screw rod operatively coupled to said first and second blades.

19. The decapping apparatus as recited in claim 15 wherein a pitch of the chisel tip of said first blade is less than a pitch of the chisel tip of said second blade.

20. The decapping apparatus as recited in claim 15 wherein said second blade includes a blocking wall formed adjacent to the chisel tip of said second blade for abutting against the main body section of said packaged integrated circuit while the chisel tip of said first blade penetrates into the interface layer of said package integrated circuit.

21. A decapping apparatus for removing a cap portion from a base portion of a packaged integrated circuit, said packaged integrated circuit including a main body section and a ring section formed beyond an outer perimeter of said main body section, said decapping apparatus comprising:
   a base;
   a first blade having a chisel portion formed along a first side of said first blade;
   a blocking member having a blocking wall formed adjacent to a first side of said blocking member, wherein said blocking member includes a chisel tip formed along the first side of said blocking member and adjacent to the blocking wall and the chisel tip of said first blade is longer than the chisel tip of said blocking member;
   support means mechanically coupled to said base for supporting said first blade and said blocking member on said mounting base such that the chisel portion of said first blade opposes the blocking wall of said blocking member;
   actuation means mechanically coupled to said base for decreasing a distance between said first and blade and said blocking member; and
   a device holding means coupled to said base for securing said packaged integrated circuit on said decapping apparatus;
   wherein the chisel portion of said first blade is positioned to contact an interface layer between said base portion and said cap portion of said packaged integrated circuit and wherein the blocking wall of said blocking member is positioned to abut against the main body section of said packaged integrated circuit.

22. The decapping apparatus as recited in claim 21 wherein the blocking wall of said blocking member is positioned to abut against the cap portion of said packaged integrated circuit.

23. The decapping apparatus as recited in claim 21 wherein said packaged integrated circuit is securable on said decapping apparatus such that the first side of said first blade abuts against a plurality of wire leads that extend between a first side of said main body section and said ring section of said packaged integrated circuit, and such that the first side of said blocking member abuts against a plurality of wire leads that extend between an opposite side of said main body section and said ring section of said packaged integrated circuit.

24. The decapping apparatus as recited in claim 21 wherein said support means includes first and second slide rods adapted to allow said first blade and said blocking member to move slidably along said first and second slide rods.

25. The decapping apparatus as recited in claim 24 wherein said actuation means includes a screw rod operatively coupled to said first blade and to said blocking member.

26. The decapping apparatus as recited in claim 21 wherein a pitch of the chisel tip of said first blade is less than a pitch of the chisel tip of said blocking member.

* * * * *